(12) United States Patent
Lin et al.

(10) Patent No.: US 9,443,894 B1
(45) Date of Patent: Sep. 13, 2016

(54) IMAGING PACKAGE WITH REMOVABLE TRANSPARENT COVER

(71) Applicant: OMNIVISION TECHNOLOGIES, INC., Santa Clara, CA (US)

(72) Inventors: Wei-Feng Lin, Hsinchu (TW); Chi-Kuei Lee, Bade (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/642,245

(22) Filed: Mar. 9, 2015

(51) Int. Cl.
*H01L 27/146* (2006.01)

(52) U.S. Cl.
CPC ... *H01L 27/14618* (2013.01); *H01L 27/14632* (2013.01); *H01L 27/14634* (2013.01); *H01L 27/14636* (2013.01)

(58) Field of Classification Search
CPC . H01L 27/146; H01L 27/30; H01L 31/0216; H01L 21/67; H01L 2224/95001
See application file for complete search history.

(56) References Cited

U.S. PATENT DOCUMENTS

| 7,088,397 B1 * | 8/2006 | Hunter | G02B 7/022 |
| | | | 250/239 |
| 7,205,532 B2 * | 4/2007 | Tai | G06F 3/0317 |
| | | | 250/239 |
| 2005/0039330 A1 * | 2/2005 | Mostafazadeh | H05K 3/325 |
| | | | 29/832 |
| 2015/0001111 A1 | 1/2015 | Wong | |

* cited by examiner

*Primary Examiner* — Peniel M Gumedzoe
(74) *Attorney, Agent, or Firm* — Blakely Sokoloff Taylor & Zafman LLP

(57) ABSTRACT

An imaging package includes an image sensor package formed with a semiconductor substrate. A removable transparent cover is bonded over the image sensor package to cover a first side the image sensor package. A lateral dimension of the removable transparent cover along a first direction is larger than a lateral dimension of the image sensor package along the first direction. An overhang portion of the removable transparent cover is defined by an exposed portion of the removable transparent cover that extends beyond a lateral side of the image sensor package along the first direction.

13 Claims, 3 Drawing Sheets

IMAGING PACKAGE WITH REMOVABLE TRANSPARENT COVER

BACKGROUND INFORMATION

1. Field of the Disclosure

This invention is related to image sensors. More specifically, examples of the present invention are related to wafer level packaging of image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Image sensors are typically implemented with supporting internal circuitry within integrated circuit packages that are mounted onto printed circuit boards. The image sensors are typically illuminated with light through a protective glass cover located on a top surface of the integrated circuit package. One of the major challenges with image sensors is the continuing effort to reduce the size and cost of the packages in which the image sensors are implemented. As image sensor technology continues to advance, there is an increasing desire to reduce the thickness and footprint of the imaging packages on printed circuit boards to create smaller, thinner, and lighter electronic devices.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
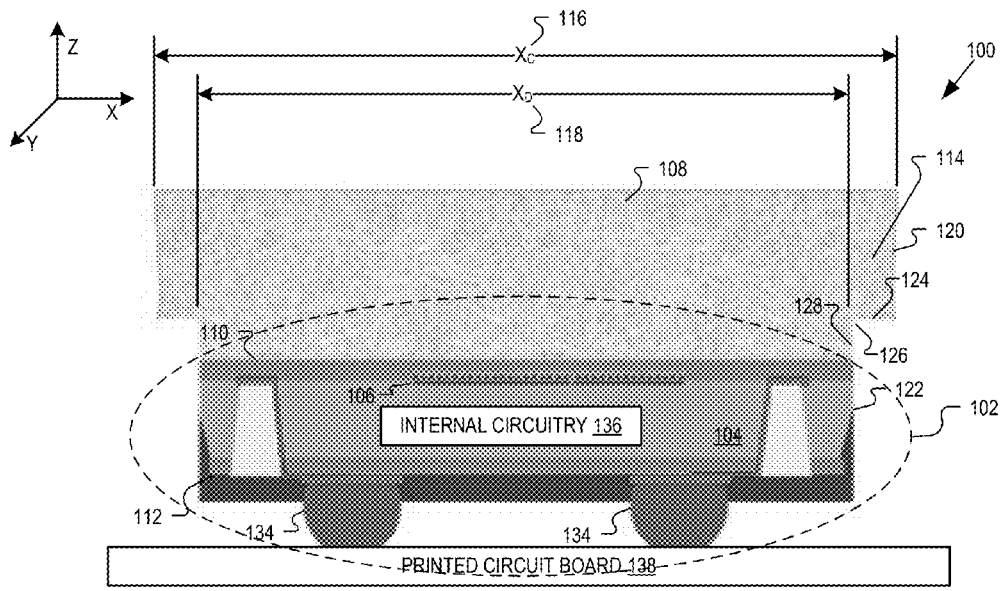
FIG. 1A is a side view diagram that shows one example of an imaging package having a removable transparent cover in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an imaging package having a removable transparent cover are disclosed. In the following description numerous specific details are set forth to provide a thorough understanding of the embodiments. One skilled in the relevant art will recognize, however that the techniques described herein can be practiced without one or more of the specific details, or with other components, materials, etc. In other instances, well-known structures, materials or operation are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be discussed, in one example, an imaging package is implemented with a lidless wafer level package for which the transparent cover can be removed in accordance with the teachings of the present invention. In the examples, the transparent cover is removed by lifting the transparent cover away from the imaging package without the need for lateral rotation. Since lateral rotation is not needed to remove the transparent cover, the transparent cover can be peeled or lifted away from the imaging package in the Z-axis direction without disturbing neighboring components that are mounted on the printed circuit board. As a result, other components can therefore be mounted on the printed circuit board closer to the imaging package, which effectively reduces the overall footprint of the imaging package on the printed circuit board in accordance with the teachings of the present invention. Furthermore, by removing the transparent cover from the imaging package, a lower Z height for the imaging package is realized, which reduces the overall thickness of the image sensing system provided on the printed circuit in accordance with the teachings of the present invention.

To illustrate, FIG. 1A is a side view diagram that shows one example of an imaging package 100 having a removable transparent cover 108 in accordance with the teachings of the present invention. As shown, imaging package 100 includes an image sensor package 102 that is formed with a semiconductor substrate 104 that includes an image sensor 106. Removable transparent cover 108 is bonded over the image sensor package 102 to cover a first side 110 of the image sensor package 102. In the example, the first side 110 is a top side of image sensor package 102, and a second side 112, which is on the opposite side of the image sensor package 102, is the bottom side of image sensor package 102.

The example depicted in FIG. 1A shows that image sensor package 102 includes image sensor 106 and internal circuitry 136 that are formed in the semiconductor substrate 104 of image sensor package 102. In one example, image sensor 106 may be a back side illuminated image sensor. In another example, it is appreciated that image sensor 106 may be a front side illuminated image sensor. For purposes of this disclosure, it is appreciated that the image sensor package 102 may be considered to include semiconductor substrate 104 as well as the associated external body, encasing or molding that encapsulates semiconductor substrate 104, including the resin, filler materials, connections, interconnects, pins, solder joints, etc., that are typically included in integrated circuit packages.

The example depicted in FIG. 1A shows that a lateral dimension $X_C$ 116 of the removable transparent cover 108 along the X-axis direction is larger than a lateral dimension $X_D$ 118 of the image sensor package 102 along the X-axis direction. As a result, an overhang portion 114 of the removable transparent cover 108 is defined by an exposed portion of the removable transparent cover 108 that extends beyond a lateral side 122 of the image sensor package 102 along the X-axis direction in accordance with the teachings of the present invention. As such, the exposed overhang portion 114 on the side of removable transparent cover 108 defines a lift location 124 of the removable transparent cover 108 in accordance with the teachings of the present invention. As will be described in further detail below, removable transparent cover 108 is adapted to be lifted at lift location 124 in the Z-axis direction to de-bond removable transparent cover 108 away from the image sensor package in accordance with the teachings of the present invention.

In one example, it is noted that the overhang portion 114 of the removable transparent cover 108 may include a notch 126. In another example, it is appreciated that the overhang portion 114 of the removable transparent cover 108 does not include notch 126, but nevertheless includes a lift location 114 on an exposed on the bottom side of the removable transparent cover 108 that extends beyond the lateral side 122 of the image sensor package 102 along the X-axis direction in accordance with the teachings of the present invention.

In the example illustrated in FIG. 1A in which notch 126 is defined in removable transparent cover 108, a portion 128, or a lateral side 128, of the notch 126 is flush with the lateral side 122 of the image sensor package 102. In that example, another portion of the notch 126 includes lift location 124, which as shown in FIG. 1A is the exposed portion of the removable transparent cover 108 that extends beyond the lateral side 122 of the image sensor package 102. As will be described in further detail below, in one example, notch 126 may be formed during a single first cut of imaging package 100, and a lateral side 120 of removable transparent cover 108 may be formed during a single second cut when the imaging package 100 and the removable transparent cover 108 are diced and separated in accordance with the teachings of the present invention.

As shown in the depicted example, imaging package 100 also includes solder joints 134 formed proximate to second side 112 of the image sensor package 102. In one example, solder joints 134 are coupled to internal circuitry 136 included in the image sensor package 102. Solder joints 134 are used to mount imaging package 100 to printed circuit board 138 as well as provide electrical connectivity between internal circuitry 136 and other components that may be mounted on or coupled to printed circuit board 138.

Figure 1B:
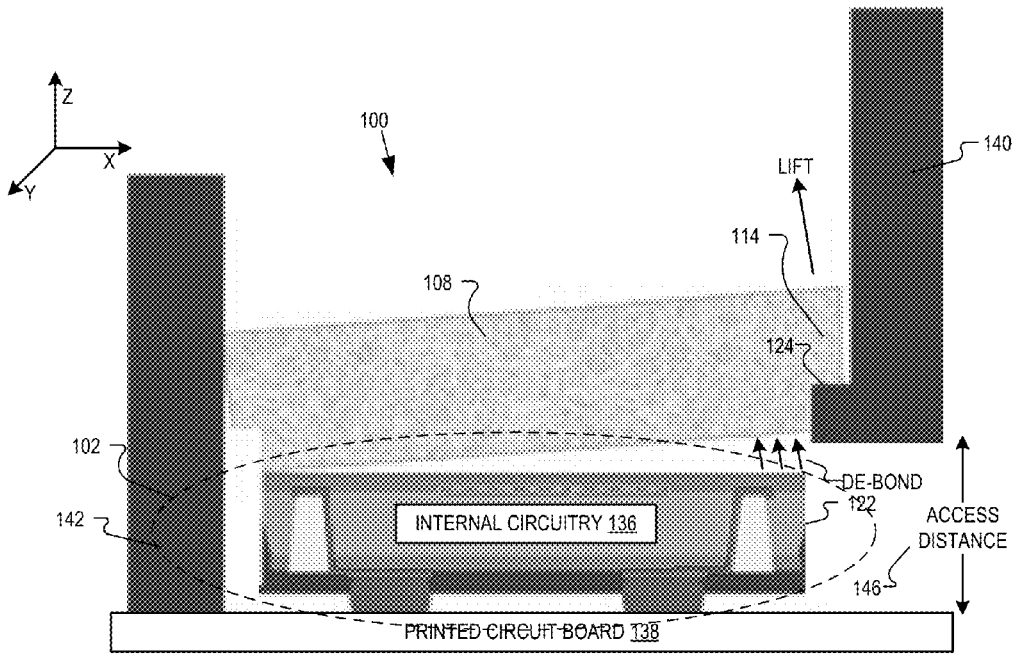
FIG. 1B is a side view diagram that shows one example of a removable transparent cover being lifted from an imaging package in accordance with the teachings of the present invention.

FIG. 1B is a side view diagram that shows an example of the removable transparent cover 108 being lifted from image sensor package 102 of imaging package 100 in accordance with the teachings of the present invention. As shown in the depicted example, there is a sufficient access distance 146 between the printed circuit board 138 and the lift location 124 on the exposed portion of the removable transparent cover 108 that extends beyond the lateral side 122 of the image sensor package 102 that provides enough room for a lift tool 140 to fit under lift location 124 to engage with the overhang 114 to pry and de-bond the removable transparent cover 108 away from the image sensor package 102 in accordance with the teachings of the present invention. In one example, a bumper or stopper 142 may be included as a part of lift tool 140 that is in contact with an opposite side of removable transparent cover 108 as shown to help prevent removable transparent cover 108 from laterally rotating and/or sliding into neighboring components on printed circuit board 138. Thus, in one example, bumper or stopper 142 may be included with lift tool 140 to stop or prevent removable transparent cover 108 from disturbing or colliding with other neighboring components that may be mounted nearby on printed circuit board 138 when removing transparent cover 108 from image sensor package 102 of imaging package 100.

Therefore, it is appreciated that by lifting off and removing transparent cover 108 from image sensor package 102 as discussed, a lidless imaging package 100 is provided in accordance with the teachings of the present invention. Imaging package 100 has advantages such as low module height and improved optical performance since transparent cover 108 is removed in accordance with the teachings of the present invention.

Figure 2A:
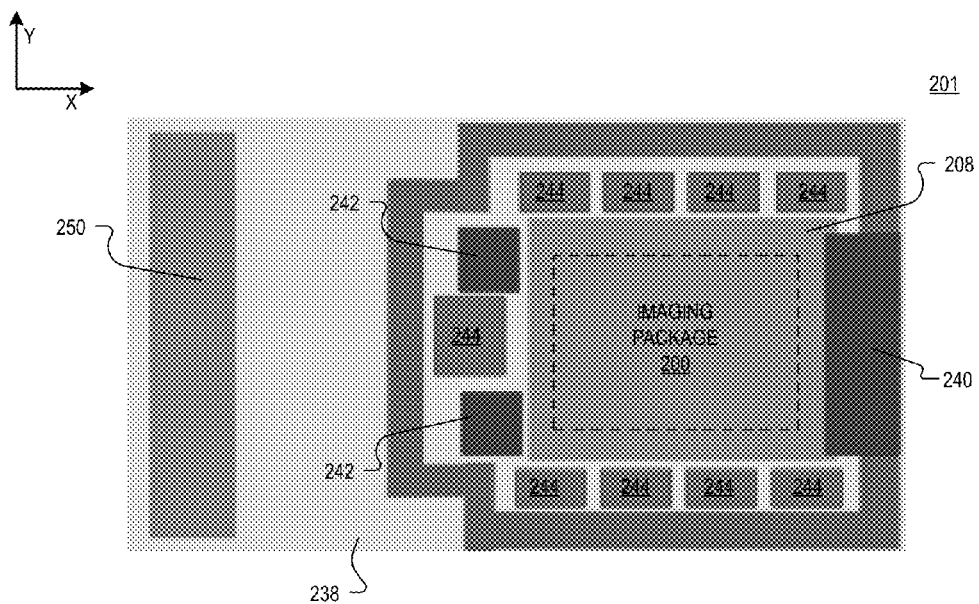
FIG. 2A is a top view diagram that shows one example of an imaging package having a removable transparent cover mounted near other surrounding components on a printed circuit board in accordance with the teachings of the present invention.

FIG. 2A is a top view diagram that shows one example of an imaging package 200 having a removable transparent cover 208 included in an imaging system 201 in accordance with the teachings of the present invention. It is appreciated that imaging package 200 may be one example of an implementation of imaging package 100 of FIGS. 1A-1B and that similarly named and numbered elements referenced below are coupled and function similar to as described above. For instance, as shown in the example depicted in FIG. 2A, image sensing system 201 includes imaging package 200 mounted on printed circuit board 238 near other surrounding components 244. In the depicted example, a connector 250 may be included on printed circuit board 238 to provide electrical connectivity to components mounted on printed circuit board 238.

Figure 2B:
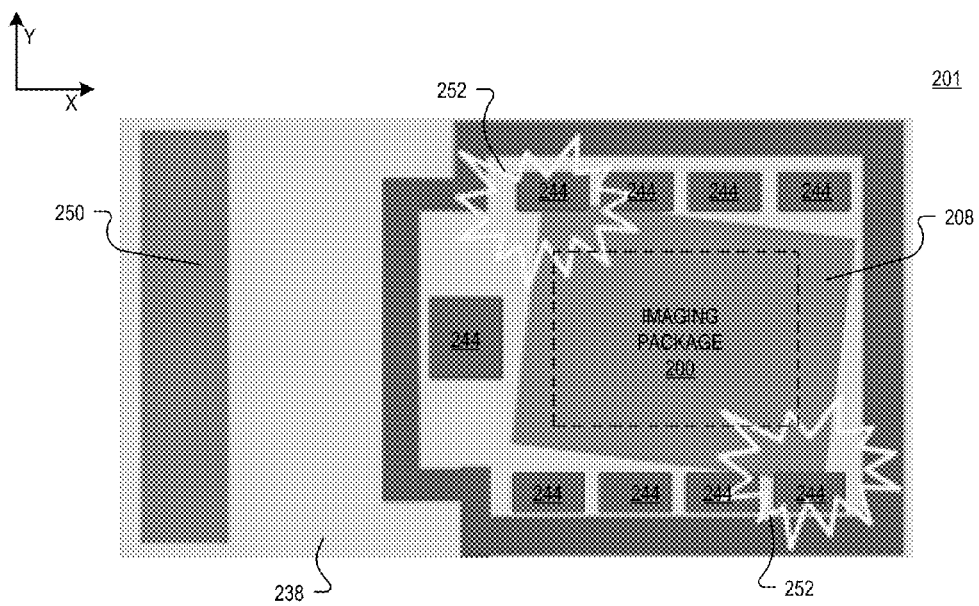
FIG. 2B is a top view diagram that shows an example of an attempt to remove a transparent cover from an imaging package by lateral rotation and colliding with other nearby components mounted on a printed circuit board.

It is appreciated that imaging package 200 and other surrounding components 244 are arranged substantially close together on printed circuit board 238, which reduces the overall size of printed circuit board 238. However, with the components packed so closely together on printed circuit board 238, there is insufficient distance between imaging package 200 and neighboring surrounding components 244 to remove transparent cover 208 by lateral rotation. Indeed, as shown in the example illustrated in FIG. 2B, an attempted removal of transparent cover 208 by lateral rotation in the X-Y plane is difficult or not possible without damaging other components due to unwanted collisions 252 that would occur with neighboring components 244 mounted on printed circuit board 238.

However, referring back to the example depicted in FIG. 2A, a lift tool 240, which in one example may include one or more bumpers or stoppers 242 as shown, may be used to remove transparent cover 208 without lateral rotation in the X-Y plane in accordance with the teachings of the present invention. By lifting removable transparent cover 208 along the Z-axis direction (which is perpendicular to the X-Y plane) with lift tool 240 engaged the overhang portion (e.g., 114 in FIGS. 1A-1B) to remove transparent cover 208, unwanted collisions 252 with neighboring components 244 are avoided in accordance with the teachings of the present invention. Therefore, imaging package 200 and other components 244 may be arranged close together as shown in FIG. 2A to reduce the size or footprint of printed circuit board 238 in accordance with the teachings of the present invention.

Figure 3A:
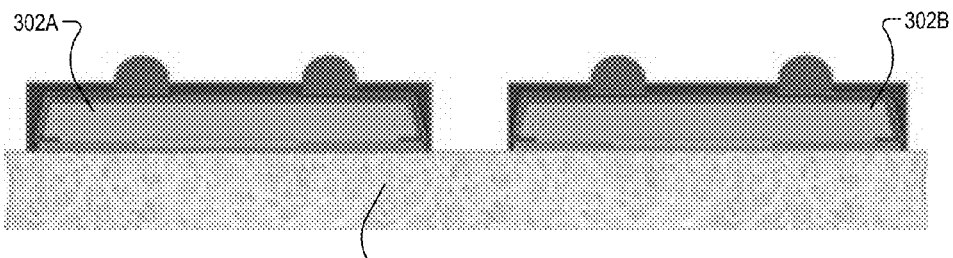
FIG. 3A is a side view diagram illustrating two example image sensor packages bonded to a transparent cover material in accordance with the teachings of the present invention.

FIG. 3A is a side view diagram illustrating two example image sensor packages 302A and 302B that are bonded to a transparent cover material 308 in accordance with the teachings of the present invention. It is appreciated that image sensor packages 302A and 302B, and transparent cover material 308 may be example implementations of image sensor package 102 and removable transparent cover 108 of FIGS. 1A-1B and/or that similarly named and numbered elements referenced below are coupled and function similar to as described above. In the example depicted in FIG. 3A, it is noted that image sensor packages 302A and 302B are illustrated as being already separate packages as bonded to transparent cover material 308.

Figure 3B:
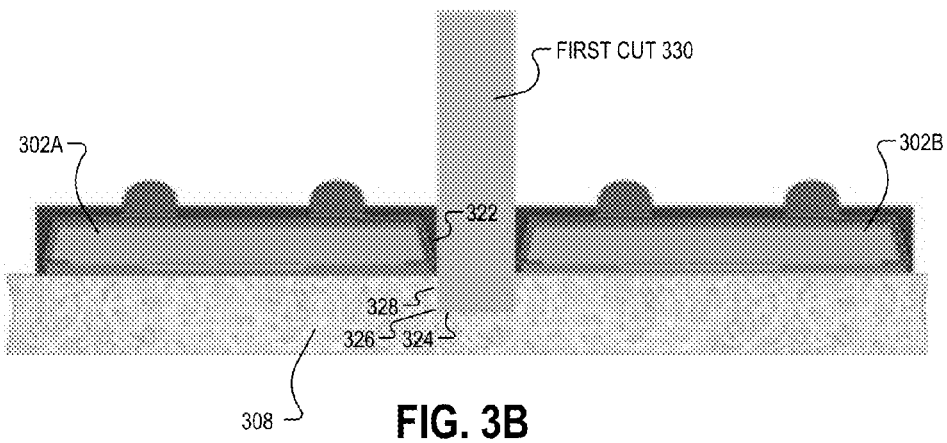
FIG. 3B is a side view diagram illustrating two example image sensor packages bonded to a transparent cover material with a first cut in accordance with the teachings of the present invention.

FIG. 3B illustrates one example of a single first cut 330 that is performed, which forms the lateral side 322 of the image sensor package 302A and a lateral side 328 of the portion of the notch 326. In one example, it is appreciated that if image sensor packages 302A and 302B were not separated prior to performing single first cut 330, that image sensor packages 302A and 302B are separated after the single first cut 330 is performed. In addition, it is noted that in the example shown in FIG. 3B that lateral side 322 of the image sensor package 302A is flush with the lateral side 328 of the exposed portion in notch 326 of the removable transparent cover 308, since both lateral side 322 and lateral side 328 are formed with the same single first cut 330. In addition, it is appreciated that lift location 324 in notch 326 is formed with single first cut 330 as shown.

Figure 3C:
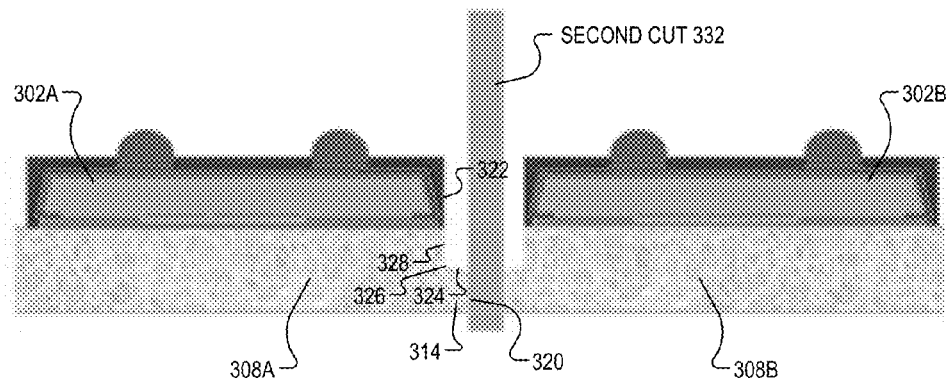
FIG. 3C is a side view diagram illustrating two example imaging packages with removable transparent covers that are separated after a second cut in accordance with the teachings of the present invention.

FIG. 3C illustrates one example of a single second cut 332 that is performed to separate removable transparent cover 308A and removable transparent cover 302B as shown. In addition, it is noted that lateral side 320 of removable transparent cover 308A is also formed with single second cut 332.

In another example, it is appreciated that if image sensor packages 302A and 302B were separated as mounted to transparent cover material 308, as illustrated in FIG. 3A, then if single first cut 330 is not performed, but if single second cut 332 is performed, notch 326 is not formed in removable transparent cover 308A, but the lift location 324 would nevertheless still be defined on the remaining bottom surface of removable transparent cover 308A near the bonding interface, which would be the overhang portion 314 of the removable transparent cover 308A defined by an exposed portion of the removable transparent cover 308A that extends beyond a lateral side 322 in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging package, comprising:
an image sensor package formed with a semiconductor substrate;
a removable transparent cover bonded over the image sensor package to cover a first side of the image sensor package, wherein a lateral dimension of the removable transparent cover along a first direction is larger than a lateral dimension of the image sensor package along the first direction; and
an overhang portion of the removable transparent cover that extends beyond a lateral side of the image sensor package along the first direction, wherein the overhang portion includes a notch defined in the removable transparent cover, wherein a portion of the notch is flush with the lateral side of the image sensor package.

2. The imaging package of claim 1 wherein the overhang portion defines a lift location of the removable transparent cover, which when lifted is adapted to de-bond the removable transparent cover from the image sensor package.

3. The imaging package of claim 1 wherein the lateral side of the image sensor package and a lateral side of the portion of the notch that is flush with the lateral side of the image sensor package are formed with a single first cut, and wherein a lateral side of the overhang portion of the removable transparent cover that extends beyond the lateral side of the image sensor package is formed with a single second cut, wherein the single second cut is separate from the single first cut.

4. The imaging package of claim 1 further comprising solder joints formed proximate to a second side of the image sensor package and coupled to internal circuitry included in the image sensor package, wherein the second side of the image sensor package is an opposite side of the first side of the image sensor package.

5. The imaging package of claim 4 wherein the imaging package is adapted to be mounted onto a printed circuit board with the solder joints, wherein the internal circuitry included in the image sensor package is coupled to other components mounted on the printed circuit board through the solder joints.

6. The imaging package of claim 5 wherein a distance between the printed circuit board and the overhang portion of the removable transparent cover that extends beyond the lateral side of the image sensor package provides sufficient access for a lift tool to engage with the overhang portion to pry the removable transparent cover from the image sensor package without laterally rotating the removable transparent cover from the image sensor package.

7. An imaging system, comprising:
a printed circuit board;

an imaging package mounted on the circuit board, wherein the imaging package includes:
  an image sensor package formed with a semiconductor substrate;
  a removable transparent cover bonded over the image sensor package to cover a top side of the image sensor package, wherein light is to be directed into the top side of the image sensor package, wherein a lateral dimension of the removable transparent cover along a first direction is larger than a lateral dimension of the image sensor package along the first direction; and
  an overhang portion of the removable transparent cover that extends beyond a lateral side of the image sensor package along the first direction, wherein the overhang portion includes a notch defined in the removable transparent cover, wherein a portion of the notch is flush with the lateral side of the image sensor package; and
other components mounted on the printed circuit board beside the imaging package.

8. The imaging system of claim 7 wherein the overhang portion defines a lift location of the removable transparent cover, which when lifted is adapted to de-bond the removable transparent cover from the image sensor package.

9. The imaging system of claim 7 wherein the lateral side of the image sensor package and a lateral side of the portion of the notch that is flush with the lateral side of the image sensor package are formed with a single first cut, and wherein a lateral side of the overhang portion of the removable transparent cover that extends beyond the lateral side of the image sensor package is formed with a single second cut, wherein the single second cut is separate from the single first cut.

10. The imaging system of claim 7 wherein the imaging package is mounted on the circuit board through solder joints formed on a bottom side of the image sensor package.

11. The imaging system of claim 10 wherein an internal circuitry included in the image sensor package is coupled to the other components mounted on the printed circuit board through the solder joints.

12. The imaging system of claim 7 wherein a distance between the printed circuit board and the overhang portion of the removable transparent cover that extends beyond the lateral side of the image sensor package provides sufficient access for a lift tool to engage with the overhang portion to pry the removable transparent cover from the image sensor package without laterally rotating the removable transparent cover from the image sensor package.

13. The imaging system of claim 7 wherein the other components mounted on the printed circuit board beside the imaging package are mounted on the printed circuit board sufficiently close to prevent the removable transparent cover from being laterally rotated to remove the removable transparent cover from the image sensor package.

\* \* \* \* \*